(12) United States Patent
Roh et al.

(10) Patent No.: US 12,359,125 B2
(45) Date of Patent: Jul. 15, 2025

(54) SILICON ETCHANT COMPOSITION, PATTERN FORMATION METHOD AND MANUFACTURING METHOD OF ARRAY SUBSTRATE USING THE ETCHANT COMPOSITION, AND ARRAY SUBSTRATE MANUFACTURED THEREFROM

(71) Applicant: DONGWOO FINE-CHEM CO., LTD., Jeollabuk-do (KR)

(72) Inventors: Jin-Kyu Roh, Seoul (KR); Ji-Won Kim, Daejeon (KR); Woo-Jun Shin, Seoul (KR)

(73) Assignee: DONGWOO FINE-CHEM CO., LTD., Jeollabuk-do (KR)

( * ) Notice: Subject to any disclaimer, the term of this patent is extended or adjusted under 35 U.S.C. 154(b) by 213 days.

(21) Appl. No.: 17/470,101

(22) Filed: Sep. 9, 2021

(65) Prior Publication Data

US 2022/0073819 A1    Mar. 10, 2022

(30) Foreign Application Priority Data

Sep. 9, 2020   (KR) .......................... 10-2020-0115151

(51) Int. Cl.
| | | |
|---|---|---|
| *C09K 13/02* | (2006.01) | |
| *C09K 13/00* | (2006.01) | |
| *H01L 21/02* | (2006.01) | |
| *H01L 21/311* | (2006.01) | |

(52) U.S. Cl.
CPC .............. *C09K 13/02* (2013.01); *C09K 13/00* (2013.01); *H01L 21/02164* (2013.01); *H01L 21/31111* (2013.01)

(58) Field of Classification Search
None
See application file for complete search history.

(56) References Cited

U.S. PATENT DOCUMENTS

| | | | |
|---|---|---|---|
| 4,297,393 A | * | 10/1981 | Denning ................. C23C 18/28 |
| | | | 438/678 |
| 10,428,271 B2 | | 10/2019 | Cooper et al. |
| 11,017,995 B2 | | 5/2021 | Chen et al. |
| 2009/0218542 A1 | | 9/2009 | Isami et al. |
| 2013/0295712 A1 | * | 11/2013 | Chen ................. H01L 31/02363 |
| | | | 257/E31.127 |
| 2014/0080313 A1 | | 3/2014 | Yu et al. |
| 2016/0200975 A1 | | 7/2016 | Cooper et al. |
| 2020/0035485 A1 | | 1/2020 | Chen et al. |
| 2023/0132229 A1 | * | 4/2023 | Huang ................. B01J 35/1019 |
| | | | 585/467 |

FOREIGN PATENT DOCUMENTS

| | | | |
|---|---|---|---|
| CN | 101519592 A | | 9/2009 |
| CN | 105492576 A | | 4/2016 |
| JP | 2006186329 A | * | 7/2006 |
| KR | 10-2009-0093814 A | | 9/2009 |
| KR | 10-2014-0079267 A | | 6/2014 |
| TW | 201412946 A | | 4/2014 |
| TW | 202014512 A | | 4/2020 |

* cited by examiner

Primary Examiner — Allan W. Olsen
(74) Attorney, Agent, or Firm — Venable LLP

(57) ABSTRACT

The present disclosure relates to a silicon etchant composition comprising (A) an alkaline compound, (B) a metal salt, and (C) water, a pattern formation method and a manufacturing method of an array substrate using the silicon etchant composition, and an array substrate manufactured therefrom.

10 Claims, No Drawings

SILICON ETCHANT COMPOSITION, PATTERN FORMATION METHOD AND MANUFACTURING METHOD OF ARRAY SUBSTRATE USING THE ETCHANT COMPOSITION, AND ARRAY SUBSTRATE MANUFACTURED THEREFROM

The present application claims priority to Korean Patent Application No. 10-2020-0115151, filed Sep. 9, 2020, the entire disclosure of each of which is incorporated by reference herein.

TECHNICAL FIELD

The present disclosure relates to a silicon etchant composition, a pattern formation method and a manufacturing method of an array substrate using the silicon etchant composition, and an array substrate manufactured therefrom

BACKGROUND ART

With the development of information technology (IT) fields, semiconductor integrated circuits (ICs), semiconductor elements, and semiconductor devices, etc., have played a gradually important role in modern society, and have been widely used in electronic devices in various industrial fields. Recently, in accordance with miniaturization, thinness, lightness, and performance improvement of the electronic devices, excellent storage capacity and a high-speed storage operation have been required in semiconductor elements used in the electronic devices. In accordance with such a high integration of the semiconductor elements, it has become necessary to form fine patterns of several tens of nanometers (nm) or less.

A manufacturing process of semiconductor elements is made by performing a series of processes such as a deposition process, a photo process, an etching process, and an ion implantation process, through which various films such as an oxide film, a nitride film, a polysilicon film, and a metal film are formed on the wafer, and these films are patterned into desired shapes to complete the desired elements. In this case, in order to achieve high integration and miniaturization of the semiconductor elements, the film to be etched needs to be removed with a high etch selectivity.

In the semiconductor elements, polysilicon, which is a polycrystalline silicon (poly-Si) material, has been used for a wide variety of purposes, such as forming a gate electrode, a capacitor electrode, a plug, an etch mask, etc. For this purpose, various methods have been developed to form a film using polysilicon, as well as to remove the formed polysilicon film.

A method of removing the polysilicon film may be mainly divided into a dry etching process and a wet etching process.

The dry etching process is performed using an etching gas in a plasma state. Specifically, the dry etching process is a method of etching using a chemical reaction between a reactive material such as ions or radicals in an etching gas and a material to be removed.

Meanwhile, the wet etching process is a method of etching using a chemical etchant, and is performed by immersing an object to be removed in an etchant. The wet etching process has advantages in that the configuration of equipment is simple and the time is shortened compared to the dry etching process. Accordingly, the demand for an etchant used in the wet etching process has grown rapidly along with the development of industries to which semiconductors were applied.

Korean Patent Laid-Open Publication No. 10-2014-0079267 relates to an etchant composition having an acid-based composition, and discloses a technique of etching a silicon nitride layer including phosphoric acid and a silicon compound, but does not disclose an etchant composition that exhibits an excellent etch rate for polysilicon, and etching characteristics are insufficient particularly in terms of uniformity of an etched surface. In addition, the acid-based etchant composition is not suitable for a structure using a silicon oxide film as a protective layer because it has a mechanism of oxidizing silicon to form a silicon oxide film and then removing the formed silicon oxide film with a fluoride such as hydrofluoric acid.

RELATED ART DOCUMENT

Patent Document (Patent Document 1) Korean Patent Laid-Open Publication No. 10-2014-0079267

DISCLOSURE

Technical Problem

An object of the present disclosure is to provide a silicon etchant composition based on an alkali composition, capable of securing an anticorrosive effect of silicon oxide and uniformity of the etched surface while maintaining etching performance of silicon in order to secure a high selectivity when etching silicon and a silicon oxide film, a pattern formation method and a manufacturing method of an array substrate using the silicon etchant composition, and an array substrate manufactured therefrom.

However, the problem to be solved by the present application is not limited to those mentioned above, and the other unmentioned problems will be clearly understood by those skilled in the art from the following description.

Technical Solution

In one aspect, there is provided a silicon etchant composition, comprising (A) an alkaline compound, (B) a metal salt, and (C) water.

In another aspect, there is provided a pattern formation method, the method including: forming a silicon film on a substrate; and etching the silicon film using the etchant composition according to the present disclosure.

In still another aspect, there are provided a manufacturing method of an array substrate including the pattern formation method, and an array substrate manufactured therefrom.

Advantageous Effects

The present disclosure provides an etchant composition capable of securing a high selectivity by inducing an anticorrosive effect of silicon oxide while maintaining etching performance to silicon, and improving uniformity of the etched surface.

Best Mode

The present disclosure relates to a silicon etchant composition, comprising (A) an alkaline compound, (B) a metal salt, and (C) water, a pattern formation method and a manufacturing method of an array substrate using the silicon etchant composition, and an array substrate manufactured therefrom.

The silicon etchant composition according to the present disclosure may secure a high selectivity by inducing an anticorrosive effect of silicon oxide while maintaining etching performance for silicon, and may improve uniformity of the etched surface.

The silicon etchant composition according to the present disclosure may show a fast etch rate by the alkaline compound, while improving an anticorrosive effect of a silicon oxide film used as a protective film by a metal salt. In addition, in a process that requires removal of a constant film thickness of silicon and etching selectivity, the silicon film may be removed at a high rate, and at the same time, a uniform etch rate may be maintained over the entire surface to increase the reliability of a subsequent process, thereby improving the quality and productivity of a semiconductor element manufactured.

The etchant composition having an alkali composition according to the present disclosure may minimize damage to the silicon oxide film because silicon (340 KJ/mol), which has a bonding energy smaller than that of the silicon oxide film (452 KJ/mol), is broken by hydroxide (OH—) of an alkaline compound, that is, silicon etching proceeds relatively quickly in a structure in which silicon is etched and a silicon oxide film is used as a protective layer. Accordingly, the etchant composition may provide an excellent effect of the etch selectivity on the silicon film and the silicon oxide film.

In general, it is known that metal ions remaining on the substrate during a semiconductor etching process are defined as impurities because they change electrical/physical properties, and affect the substrate because they act as impurities during a continuous process even when they remain on the process facility as well as on the silicon film. For this reason, a metal salt was not considered as an etchant component at all in the conventional semiconductor process. However, the present disclosure confirmed that the anticorrosive effect of the silicon oxide film was greatly improved when a specific metal salt was contained in the etchant. Metal ions generated by using an etchant composition comprising a metal salt according to the present disclosure, may be removed by post-treatment with an acidic solution.

The etchant composition according to the present disclosure is an etchant composition for etching silicon, and preferably may be used for etching polysilicon, and has anticorrosive properties for silicon oxide, such that silicon may be selectively etched. Specifically, the silicon to be etched in the present disclosure has a polycrystalline structure and shows a fast etch rate in an acid/alkali environment. Thus, the silicon is polysilicon mainly used as a dummy structure in a process that requires a fast etch rate, and may be dummy silicon used in a process that requires a fast etch rate, such as a structure having a deep trench.

In the present specification, silicon or a silicon film may refer to polysilicon or a polysilicon film.

<Silicon Etchant Composition>

The silicon etchant composition according to the present disclosure comprises: (A) an alkaline compound and (B) a metal salt, and may comprise (C) water as a solvent, and may further comprise (D) an additive, if necessary.

In addition, the silicon etchant composition according to the present disclosure does not comprise a fluorine-based additive (fluoride), Fluoride (F) such as hydrogen fluoride is generally used for removing the oxide film because the fluoride is easy to bind with the silicon oxide and thus serves to break the bond of the silicon oxide film. Thus, when the etchant composition comprises a fluorine-based additive, since the corrosion resistance to silicon oxide is inhibited, it is preferable that the etchant composition according to the present disclosure to improve the corrosion resistance properties to the silicon oxide does not comprise the fluorine-based additive.

(A) Alkaline Compound

The alkaline compound contained in the etchant composition according to the present disclosure is added for etching polysilicon, and may improve the etch rate of the etchant composition.

In addition, the alkaline compound used in the present disclosure may be used to increase the etching properties of silicon as a factor for increasing the concentration of OH in the composition, and may include organic hydroxide or inorganic hydroxide.

The organic hydroxide may be classified depending on its structure, may include a quaternary alkylammonium compound, an azabicyclo-type compound, a diazabicyclo-type compound, and a triazabicyclo-type compound, and, for example, may be selected from the group consisting of -butane, -petane, -hexane, -heptane, -octane, -nonane, -decane, -undecane, -dodecane, -tridecane, -tetradecane, -nonene, -decene, and -undecene depending on the number of carbons and bonds, among the group of azabicyclo-type, diazabicyclo-type, and triazabicyclo-type compounds in which nitrogen is included in a carbon-containing bicyclo structure, The inorganic hydroxide may, for example, include lithium hydroxide, sodium hydroxide, potassium hydroxide, rubidium hydroxide, cesium hydroxide, francium hydroxide, etc.

In one embodiment of the present application, the quaternary alkylammonium compound is a quaternary alkylammonium hydroxide, and may be a compound represented by the following Formula 1:

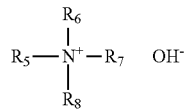

[Formula 1]

wherein $R_5$ to $R_8$ are each independently a hydrocarbon group having 1 to 8 carbon atoms, preferably an alkyl group having 1 to 8 carbon atoms, and more preferably an alkyl group having 1 to 4 carbon atoms.

For example, the compound represented by Formula 1 may be one or more selected from the group consisting of tetramethylammonium hydroxide, tetraethylammonium hydroxide, tetrapropylammonium hydroxide, tetrabutylammonium hydroxide, tetrahexylammonium hydroxide, tetraoctylammonium hydroxide, benzyltriethylammonium hydroxide, diethyldimethylammonium hydroxide, and methyltributylammonium hydroxide, preferably one or more selected from the group consisting of tetramethylammonium hydroxide, tetraethylammonium hydroxide, tetrapropylammonium hydroxide, tetrabutylammonium hydroxide, tetrahexylammonium hydroxide, and tetraoctylammonium hydroxide, and more preferably one or more selected from the group consisting of tetramethylammonium hydroxide, tetraethylammonium hydroxide, tetrapropylammonium hydroxide, and tetrabutylammonium hydroxide.

The content of the alkaline compound is preferably 1 to 23% by weight, more preferably 1 to 20% by weight, and most preferably 1 to 15% by weight, based on the total weight of the composition. If the content of the alkaline compound is less than 1% by weight, the etch rate of the target silicon is reduced and the dissolving power of the silicon-based compound is lowered. If the content of the alkaline compound is more than 23% by weight, the silicon etch rate by the cation of the alkaline compound is decreased.

(B) Metal Salt

The metal salt contained in the etchant composition according to the present disclosure may be added for improving the corrosion resistance to the silicon oxide film.

The metal salt is included so that a "Si—O—" structure exposed on the surface of the silicon oxide film may combine with the metal to form a metallo-silicate structure, and a sol-gel process may form a composite structure of metal and silicate on the surface of the silicon oxide film, and thus the effect of blocking the damage to the silicon oxide film by OH⁻ of the alkaline compound may appear. For example, in the case of an aluminum salt, mesoporous alumino-silicate may be formed on the surface, resulting in an anticorrosive effect of silicon oxide.

The metal salt includes any one of a transition metal and a post-transition metal. For example, the metal salt may be one or more selected from the group consisting of an aluminum (Al) salt, an iron (Fe) salt, a titanium (Ti) salt, a vanadium (V) salt, a chromium (Cr) salt, a manganese (Mn) salt, a cobalt (Co) salt, a nickel (Ni) salt, a copper (Cu) salt, a zinc (Zn) salt, a gallium (Ga) salt, a zirconium (Zr) salt, a niobium (Nb) salt, a molybdenum (Mo) salt, a technetium (Tc) salt, a ruthenium (Ru) salt, a rhodium (Rh) salt, a palladium (Pd) salt, a silver (Ag) salt, a cadmium (Cd) salt, an indium (In) salt, a tin (Sn) salt, a hafnium (Hf) salt, a tantalum (Ta) salt, a tungsten (W) salt, a rhenium (Re) salt, an osmium (Os) salt, an iridium (Ir) salt, a platinum (Pt) salt, a gold (Au) salt, a mercury (Hg) salt, a thallium (Tl) salt, a lead (Pb) salt, a bismuth (Bi) salt, a polonium (Po) salt, a scandium (Sc) salt, and an yttrium (Y) salt. Preferably, the metal salt may be one or more selected from the group consisting of an aluminum (Al) salt, an iron (Fe) salt, and a titanium (Ti) salt.

In the present disclosure, the metal salt may be selected from the group consisting of a form bonded to an inorganic or organic anion or a metal ion, and may include one or more selected from the group consisting of hydroxide, oxide, chloride, bromine, iodine, acetate, nitrite, nitrate, sulfate, sulfide, bromide, isopropoxide, butoxide, silicate, acetylacetonate, ethoxide, phosphate, phosphite, fluoromethanesulfonate, carbide, perchlorate, titanate, cesium, nickel/cobalt, phenoxide, boride, and carbonate of the metal.

For example, the aluminum salt may include an aluminum solution, aluminum hydroxide, aluminum acetate, aluminum nitride, aluminum nitrate, aluminum chloride, aluminum sulfate, aluminum sulfide, aluminum bromide, aluminum oxide, and aluminum carbonate, etc.

For example, the iron salt may include iron acetate, iron bromide, iron chloride, iron iodine, iron acetylacetonate, iron sulfate, iron nitrate, and iron oxide, etc.

The content of the metal salt is preferably 0.01 to 1.5% by weight, more preferably 0.01 to 0.5% by weight, based on the total weight of the composition. If the content of the metal salt is less than 0.01%, the anticorrosive effect on the silicon oxide film is insignificant. If the content of the metal salt exceeds 1.5%, the etch rate may be inhibited by acting on the surface of the target silicon.

(C) Water

The water contained in the etchant composition according to the present disclosure may be deionized water for a semiconductor process, and preferably 18 M Ω/cm or more of the deionized water may be used.

In the present disclosure, a balance of water may be included, and the balance means an amount such that the total weight of the composition, which further contains essential components and other components of the present disclosure, is 100% by weight.

Specifically, the water may be included in an amount of 75 to 95% by weight, based on the total weight of the composition.

(D) Additive

The etchant composition of the present disclosure may further comprise one or more additives to improve etching properties, and examples of the additive may include a silicon-based compound and an alkanolamine-based compound, etc. Specifically, the silicon-based compound may increase corrosion resistance to silicon oxide, and the alkanolamine-based compound may improve uniformity of the etched surface by reducing the non-uniform etching of the surface by silicate after etching.

The silicon-based compound may include powdered silicon or a compound represented by the following Formula 2:

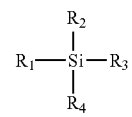

[Formula 2]

wherein $R_1$ to $R_4$ are each independently a hydrogen atom, a hydroxyl group, an alkoxy group having 1 to 5 carbon atoms, an acetate group having 1 to 5 carbon atoms, an aryl group having 6 to 30 carbon atoms, or an alkyl group having 1 to 5 carbon atoms that is unsubstituted or substituted with one or more of a hydroxyl group, an alkoxy group, and an amino group, and at least one of $R_1$ to $R_4$ includes a hydroxyl group or an alkoxy group.

The compound represented by Formula 2 may include at least one hydroxyl group and/or an alkoxy group, and thus corrosion resistance to silicon oxide may be further improved.

Examples of the compound represented by Formula 2 may include, but are not limited to, tetramethoxysilane, tetraethoxysilane, tetrapropoxysilane, tetrabutoxysilane, trimethylsilanol, triethylsilanol, diphenylsilanediol, aminopropylsilanetriol, tetrakis (2-hydroxyethoxy) silane, trimethylethoxysilane, diethoxymethylsilane, methyltrimethoxysilane, tetramethyl orthosilicate, diethyl (isopropyl) silanol, tetrabutyldimethylsilanol, dimethylphenylsilanol, trimethyl (phenoxy) silane, methoxytrimethylsilane, diethoxydimethylsilane, diethoxydiethylsilane, diethoxymethylphenylsilane, trimethoxy (methyl) silane, triethoxymethyl silane, ethyl trimethoxysilane, triethoxy (propyl) silane, butyltriethoxysilane, orthosilicic acid, and 1,2-bis(triethoxysily) ethane, etc.

The powdered silicon (Si) may in the form of particles having a size of several tens of micrometers, and may be single silicon or a structure in which a silicon oxide film is formed on the surface.

The silicon-based compound exists in the form of silicate in an alkaline composition, and the silicate structure acts on the surface of the silicon oxide film to aid corrosion resistance.

The content of the silicon-based compound may be 1% by weight or less, preferably 0.03 to 1% by weight, and more preferably 0.5 to 1% by weight, based on the total weight of the composition. If the content of the silicon-based compound is excessively small, the amount of silicate produced is small, so the effect of improving the corrosion resistance to the silicon oxide film is not shown. If the content of the silicon-based compound is excessively large, the target silicon etch rate is reduced, and the uniformity of the etched surface deteriorates.

The alkanolamine-based compound may be selected from the group containing an amino group, a hydroxyl group, or an alkyl group, and the alkanolamine-based additive may contribute to reducing non-uniformity of the silicon etching surface, which is caused by re-adsorption on the silicon surface when the content of silicate is increased.

For example, the alkanolamine-based compound may includes 1-amino-2-propanol, 2-amino-1-butanol, 3-amino-1-propanol, 3-amino-1,2-propanediol, 2,3-budanediol, diethylenetriamine, isopropylamine, methyldiethanolamine, triethylamine, trimethylamine, methylamine, ethylamine, propanolamine, ethanolamine, aniline, 2-aminopentane, diethylamine, diethanolamine, N-methylethanolamine, N-methyldiethanolamine, 2-amino-3-methyl-1-butanol, 3-amino-2,2-dimethyl-1-propanol, tris(hydroxymethyl)aminomethane, 1,2-diaminopropane, 1,3-diamino-2-propanol, 2-amino-2-methyl-1,3-propanediol, 3-methylamino-1-propanol, 2-dimethylamino-2-methyl-1-propanol, 1-dimethylamino-2-propanol, 3-dimethylamino-1-propanol, 2-dimethylamino-1-propanol, 2-diethylamino-1-propanol, 2-diethylamino-1-ethanol, 2-ethylamino-1-ethanol, 1-(dimethylamino)2-propanol, diethanolamine N-propyldiethanolamine, N-isopropyldiethanolamine; N-(2-methylpropyl)diethanolamine, N-n-butyldiethanolamine, N-t-butylethanolamine, N-cyclohexyldiethanolamine, N-dodecyldiethylamine, 2-(dimethylamino)ethanol; 2-diethylaminoethanol, 2-dipropylaminoethanol, 2-butylaminoethanol, 2-t-butylaminoethanol, 2-cycloaminoethanol, 2-amino-2-pentanol, 2-[bis(2-hydroxyethyl)amino]-2-methyl-1-propanol, 2-[bis(2-hydroxyethyl)amino]-2-propanol, N,N-bis(2-hydroxypropyl)ethanolamine, 2-amino-2-methyl-1-propanol, tris(hydroxymethyl)aminomethane, triisopropanolamine, trimethylpyridine, or dimethylpyridine, etc.

The content of the alkanolamine-based compound may be 20% by weight or less, preferably 0.5 to 20% by weight, and more preferably in an amount of 1 to 20% by weight, based on the total weight of the composition. If the content of the alkanolamine-based compound is excessively small, the effect of improving the uniformity of the etched surface is insignificant. If the content of the alkanolamine-based compound is excessively large, the surface activity of the silicate is lowered, the anticorrosive effect of the silicon oxide film is lowered, and the amount of adsorption is also increased on the target silicon surface, thereby causing a decrease in the etch rate.

<Patten Formation Method>

Further, the present disclosure provides a pattern formation method using the etchant composition according to the present disclosure. The pattern formation method according to the present disclosure may form a pattern according to a known pattern forming method, except that the etchant composition according to the present disclosure is used.

For example, the pattern formation method includes: forming a silicon film on a substrate; and etching the silicon film using an etchant composition according to the present disclosure. Here, the silicon film includes a polysilicon film.

The above-mentioned silicon etchant composition is used in an etching process of the silicon film. In this case, an etching method of the polysilicon film may be performed by a method commonly known in the art. For example, in a batch type etching device or a single type etching device, a method using deposition, spraying, or deposition and spraying may be used. Also, the reliability of the element may be increased only when a fast etch rate and etch uniformity are secured.

Further, the pattern formation method may further include forming a silicon oxide film, and in this case, the etching of the silicon film may include selectively etching the silicon film with the etchant composition.

In addition, after the etching of the silicon film, a step of removing metal ions may be further included. When etching is performed using the etchant composition containing the metal salt according to the present disclosure, metal ions are generated, and the metal ions may be removed through a post-treatment process using an acidic solution.

<Manufacturing Method of Array Substrate>

In addition, the present disclosure provides a manufacturing method of an array substrate using the etchant composition according to the present disclosure. The array substrate may be manufactured according to the known manufacturing method of an array substrate, except that the etchant composition according to the present disclosure is used.

For example, the manufacturing method of an array substrate includes the above-mentioned pattern formation method, and specifically, in the manufacturing method of the array substrate, including: a) forming a gate electrode on the substrate; b) forming a gate insulating layer on the substrate including the gate electrode; c) forming a semiconductor layer (a-Si:H) on the gate insulating layer; d) forming a source/drain electrode on the semiconductor layer; and e) forming a pixel electrode connected to the drain electrode, the step a), b), or c) may include etching using the etchant composition according to the present disclosure.

<Array Substrate Manufactured According to Manufacturing Method of Array Substrate>

In addition, the present disclosure may include an array substrate manufactured according to the manufacturing method of an array substrate described above, and all elements including the same.

For example, the array substrate may be a thin film transistor (TFT) array substrate.

Hereinafter, the present disclosure will be described in more detail with reference to Examples. However, the following examples are for describing the present disclosure in more detail, and the scope of the present disclosure is not limited by the following examples.

EXAMPLES AND COMPARATIVE EXAMPLES: PREPARATION OF A SILICON ETCHANT COMPOSITION

The silicon etchant compositions according to Examples and Comparative Examples were prepared with reference to Tables 1 and 2 below.

TABLE 1

| (Unit: % by weight) | Alkaline compound | | | Metal salt | | | | Additive | | | | Water |
|---|---|---|---|---|---|---|---|---|---|---|---|---|
| | A-1 | A-2 | A-3 | B-1 | B-2 | B-3 | B-4 | C-1 | C-2 | D-1 | D-2 | |
| Example 1 | 10 | | | 0.1 | | | | | | | | Balance |
| Example 2 | | 20 | | 0.1 | | | | | | | | Balance |
| Example 3 | | | 1 | 0.1 | | | | | | | | Balance |
| Example 4 | 15 | | | 0.1 | | | | | | | | Balance |
| Example 5 | 10 | | | | 0.01 | | | | | | | Balance |
| Example 6 | 10 | | | | | 0.5 | | | | | | Balance |
| Example 7 | 10 | | | | | | 1 | | | | | Balance |
| Example 8 | 10 | | | 0.1 | | | | 0.05 | | | | Balance |
| Example 9 | 10 | | | 0.1 | | | | | 0.1 | | | Balance |
| Example 10 | 10 | | | 0.1 | | | | 1 | | | | Balance |
| Example 11 | 10 | | | 0.1 | | | | | | 1 | | Balance |
| Example 12 | 10 | | | 0.1 | | | | | | | 10 | Balance |
| Example 13 | 10 | | | 0.1 | | | | | | 20 | | Balance |
| Example 14 | 10 | | | 0.1 | | | | 1 | | 10 | | Balance |
| Example 15 | 23 | | | 0.1 | | | | | | | | Balance |
| Example 16 | 23 | | | 0.1 | | | | 1 | | | | Balance |
| Example 17 | 23 | | | 0.1 | | | | | | 10 | | Balance |
| Example 18 | 23 | | | 0.1 | | | | 1 | | 10 | | Balance |
| Example 19 | 10 | | | 1.5 | | | | | | | | Balance |
| Example 20 | 10 | | | 1.5 | | | | 1 | | | | Balance |
| Example 21 | 10 | | | 1.5 | | | | | | 10 | | Balance |
| Example 22 | 10 | | | 2.0 | | | | 1 | | 10 | | Balance |
| Example 23 | 10 | | | 0.1 | | | | 0.03 | | | | Balance |
| Example 24 | 10 | | | 0.1 | | | | 1.5 | | | | Balance |
| Example 25 | 10 | | | 0.1 | | | | | | 0.5 | | Balance |
| Example 26 | 10 | | | 0.1 | | | | | | 23 | | Balance |

TABLE 2

| (Unit: % by weight) | Alkaline compound | | | Inorganic salt | | | Additive | | Water |
|---|---|---|---|---|---|---|---|---|---|
| | A-1 | A-2 | A-3 | B-1 | E-1 | E-2 | C-1 | D-1 | |
| Comp. Example 1 | 10 | | | | 0.1 | | | | Balance |
| Comp. Example 2 | 10 | | | | 0.1 | | 1 | | Balance |
| Comp. Example 3 | 10 | | | | 0.1 | | | 10 | Balance |
| Comp. Example 4 | 10 | | | | 0.1 | | 1 | 10 | Balance |
| Comp. Example 5 | 10 | | | | | 0.1 | | | Balance |
| Comp. Example 6 | 10 | | | | | 0.1 | 1 | | Balance |
| Comp. Example 7 | 10 | | | | | 0.1 | | 10 | Balance |
| Comp. Example 8 | 10 | | | | | 0.1 | 1 | 10 | Balance |
| Comp. Example 9 | 10 | | | | | | | | Balance |
| Comp. Example 10 | | 20 | | | | | | | Balance |
| Comp. Example 11 | | | 1 | | | | | | Balance |
| Comp. Example 12 | 10 | | | | | | 1 | | Balance |
| Comp. Example 13 | 10 | | | | | | | 10 | Balance |
| Comp. Example 14 | 10 | | | | | | 1 | 10 | Balance |
| Comp. Example 15 | | | | 0.1 | | | 1 | | Balance |
| Comp. Example 16 | | | | 0.1 | | | | 10 | Balance |
| Comp. Example 17 | | | | 0.1 | | | 1 | 10 | Balance |
| Comp. Example 18 | | | | 0.1 | | | | | Balance |
| Comp. Example 19 | | | | | | | 1 | | Balance |
| Comp. Example 20 | | | | | | | | 10 | Balance |

<Alkaline Compound>
  A-1: Tetramethylammonium hydroxide
  A-2: 1,8-diazabicyclo [5.4.0]undec-7-ene
  A-3: Sodium hydroxide
<Metal Salt>
  B-1: Aluminum hydroxide
  B-2: Aluminum acetate
  B-3: Iron chloride
  B-4: Titanium chloride
<Silicon-Based Compound>
  C-1: Powdered silicon (size <100 nm)
  C-2: Tetraethoxysilane
<Alkanolamine Compound>
  D-1: 1-amino-2-propanol
  D-2: 2-amino-1-butanol <Inorganic Salt>
  E-1: Sodium acetate
  E-2: Potassium chloride Experimental Example For the etchant compositions according to the Examples and Comparative Examples, performance evaluation was performed as follows.
Evaluation 1: Evaluation of Etch Rate to Silicon Film
Specimens were prepared by cutting a wafer on which silicon was deposited at a thickness of 6000 Å on a silicon wafer into a size of 1.5×1.5 cm. The specimens were immersed in the etchant compositions of the Examples and Comparative Examples under the condition of 80° C. and 400 rpm for 30 seconds. Then, the specimens were taken out, washed with water, and then dried using air. Thereafter, the thickness of each silicon film was measured using an ellipsometer, and the etch rate of each silicon film was calculated with change values in the thickness of each film. In this case, the etch rate was evaluated based on the following criteria, and the results are shown in Tables 3 and 4 below.

<Evaluation Criteria>
- ⊚: etch rate of 4500 Å/min or more
- ○: etch rate less than 4500 Å/min and more than or equal to 3500 Å/min
- Δ: etch rate less than 3500 Å/min and more than or equal to 2500 Å/min
- X: etch rate less than 2500 Å/min Evaluation 2: Evaluation of Etch Selectivity of Silicon Film/Silicon Oxide Film Specimens were prepared by cutting the silicon oxide film into a size of 1.5×1.5 cm. The specimens were immersed in the etchant compositions of the Examples and Comparative Examples under the condition of 80° C. and 400 rpm for 10 minutes. Then, the specimens were taken out, washed with water, and then dried using air. Thereafter, the thicknesses of the silicon oxide films were measured using an ellipsometer, and the etch rates were calculated with changes in the thickness before and after etching. In this case, the etch rate of the silicon film (measured in the Evaluation 1) and the etch rate of the silicon oxide film were substituted into Equation 1 below and converted into an etch selectivity. Evaluation was performed according to the following criteria, and the results are shown in Tables 3 and 4 below.

$$\frac{\text{Etch rate of silicon film}}{\text{Etch rate of silicon oxide film}} = \text{Etch selectiviy} \quad \text{[Equation 1]}$$

<Evaluation Criteria>
- ⊚: etch selectivity of 15000 or more
- ○: etch selectivity more than or equal to 10000 and less than 15000
- Δ: etch selectivity more than or equal to 5000 and less than 10000
- X: etch selectivity less than 5000

Evaluation 3: Evaluation of Surface Roughness of Silicon Film

After the etching was evaluated, the surface roughness of the silicon film and the silicon oxide film wafer pieces was measured using atomic force microscopy (AFM). In this case, the surface roughness was evaluated according to the following criteria, and the results are shown in Tables 3 and 4 below.

<Evaluation Criteria>
- ⊚: 10 Å or less
- ○: less than or equal to 20 Å and more than 10 Å
- Δ: less than or equal to 50 Å and more than 20 Å
- X: more than 50 Å

Evaluation 4: Evaluation of Mixing Stability of Etchant Composition

Since the composition is a mixture of inorganic salts and organic materials, if each component remains undissolved or recrystallized, it may act as an impurity during etching of the silicon film. In order to confirm this, mixing stability was evaluated by performing light transmittance analysis of the composition with UV-Vis spectroscopy equipment. In this case, mixing stability (light transmittance) was evaluated according to the following criteria, and the results are shown in Tables 3 and 4 below.

<Evaluation Criteria>
- ⊚: 100%
- ○: less than 100% and more than or equal to 98%
- Δ: less than 98% and more than or equal to 95%
- X: less than 95%

TABLE 3

| | Etch rate of silicon | Etch selectivity | Surface roughness of silicon | Mixing stability |
|---|---|---|---|---|
| Example 1 | ⊚ | ⊚ | ○ | ⊚ |
| Example 2 | ⊚ | ⊚ | ○ | ⊚ |
| Example 3 | ⊚ | ⊚ | ○ | ⊚ |
| Example 4 | ⊚ | ⊚ | ○ | ⊚ |
| Example 5 | ⊚ | ⊚ | ○ | ⊚ |
| Example 6 | ⊚ | ⊚ | ○ | ⊚ |
| Example 7 | ⊚ | ⊚ | ○ | ⊚ |
| Example 8 | ⊚ | ⊚ | ○ | ⊚ |
| Example 9 | ⊚ | ⊚ | ○ | ⊚ |
| Example 10 | ⊚ | ⊚ | ○ | ⊚ |
| Example 11 | ⊚ | ⊚ | ⊚ | ⊚ |
| Example 12 | ⊚ | ⊚ | ⊚ | ⊚ |
| Example 13 | ⊚ | ⊚ | ⊚ | ⊚ |
| Example 14 | ⊚ | ⊚ | ⊚ | ⊚ |
| Example 15 | ○ | ○ | ○ | ⊚ |
| Example 16 | ○ | ⊚ | ○ | ⊚ |
| Example 17 | ○ | ○ | ⊚ | ⊚ |
| Example 18 | ○ | ⊚ | ⊚ | ⊚ |
| Example 19 | ○ | ○ | ○ | ⊚ |
| Example 20 | ○ | ⊚ | ○ | ⊚ |
| Example 21 | ○ | ○ | ⊚ | ⊚ |
| Example 22 | Δ | ⊚ | ⊚ | ⊚ |
| Example 23 | ⊚ | ⊚ | ○ | ⊚ |
| Example 24 | Δ | Δ | ○ | ○ |
| Example 25 | ⊚ | ⊚ | ○ | ⊚ |
| Example 26 | Δ | Δ | ⊚ | ⊚ |

TABLE 4

| | Etch rate of silicon | Etch selectivity | Surface roughness of silicon | Mixing stability |
|---|---|---|---|---|
| Comp. Example 1 | ⊚ | X | ○ | ⊚ |
| Comp. Example 2 | ⊚ | X | ○ | ⊚ |
| Comp. Example 3 | ⊚ | X | ⊚ | ⊚ |
| Comp. Example 4 | ⊚ | X | ⊚ | ⊚ |
| Comp. Example 5 | ⊚ | X | ○ | ⊚ |
| Comp. Example 6 | ⊚ | X | ○ | ⊚ |
| Comp. Example 7 | ⊚ | X | ⊚ | ⊚ |
| Comp. Example 8 | ⊚ | X | ⊚ | ⊚ |
| Comp. Example 9 | ⊚ | X | ○ | ⊚ |
| Comp. Example 10 | ⊚ | X | ○ | ⊚ |
| Comp. Example 11 | ⊚ | X | ○ | ⊚ |
| Comp. Example 12 | ⊚ | X | ○ | ⊚ |
| Comp. Example 13 | ⊚ | X | ⊚ | ⊚ |
| Comp. Example 14 | ⊚ | X | ⊚ | ⊚ |
| Comp. Example 15 | X | X | ⊚ | X |

TABLE 4-continued

| | Etch rate of silicon | Etch selectivity | Surface roughness of silicon | Mixing stability |
|---|---|---|---|---|
| Comp. Example 16 | X | X | ◎ | Δ |
| Comp. Example 17 | X | X | ◎ | X |
| Comp. Example 18 | X | X | ◎ | ◎ |
| Comp. Example 19 | X | X | ◎ | X |
| Comp. Example 20 | X | X | ◎ | ◎ |

In the present Experimental Example, evaluation was performed in terms of etch rate of silicon, etch selectivity, surface roughness of silicon, and mixing stability for the etchant compositions according to Examples and Comparative Examples of the present disclosure.

It could be confirmed that the etchant composition containing the alkaline compound and the metal salt according to the present disclosure had the corrosion resistance of the silicon oxide film, and thus had excellent etch selectivity to the silicon film and the silicon oxide film. Specifically, it could be confirmed that when an inorganic salt was used instead of a metal salt (Comparative Examples 1 to 8), the etch selectivity was significantly lowered, and when the metal salt was included in excess (Example 22), the etch rate was slightly decreased.

In addition, it could be confirmed that when the silicon-based compound was added, the corrosion-resistant performance to the silicon oxide film was improved, and the etch selectivity was also improved, and when the alkanolamine-based compound was added, the surface uniformity was improved. However, when the additive was added in excess (Examples 13 and 26), the etch rate and etch selectivity of silicon were lowered.

The invention claimed is:

1. A silicon etchant composition, comprising an alkaline compound, a metal salt, and water,
    wherein the metal salt is in an amount of 0.1 to 1.5% by weight relative to a total weight of the silicon etchant composition,
    wherein an etch selectivity according to Equation 1 is equal to or greater than 10,000 when etching a silicon film and a silicon oxide film using the silicon etchant composition, $$\frac{\text{Etch rate of silicon film}}{\text{Etch rate of silicon oxide film}} = \text{Etch selectivity}, \quad \text{[Equation 1]}$$

wherein the metal salt is one or more of aluminum hydroxide, aluminum acetate, iron chloride, and titanium chloride.

2. The silicon etchant composition of claim 1, wherein the silicon etchant composition comprises 1 to 23% by weight of the alkaline compound relative to the total weight of the silicon etchant composition.

3. The silicon etchant composition of claim 1, wherein the alkaline compound includes organic hydroxide, inorganic hydroxide, or an azabicyclo-type compound, wherein the azabicyclo-type compound comprises one or more selected from the group consisting of an azabicyclo compound, a diazabicyclo compound, and a triazabicyclo compound.

4. The silicon etchant composition of claim 3, wherein the organic hydroxide comprises a quaternary alkylammonium compound.

5. The silicon etchant composition of claim 3, wherein the inorganic hydroxide is one or more selected from the group consisting of lithium hydroxide, sodium hydroxide, potassium hydroxide, rubidium hydroxide, cesium hydroxide, and francium hydroxide.

6. The silicon etchant composition of claim 1, further comprising one or more additives selected from powdered silicon, a compound represented by Formula 2, and an alkanolamine-based compound

[Formula 2]

wherein $R_1$ to $R_4$ are each independently a hydrogen atom, a hydroxyl group, an alkoxy group having 1 to 5 carbon atoms, an acetate group having 1 to 5 carbon atoms, an aryl group having 6 to 30 carbon atoms, or an alkyl group having 1 to 5 carbon atoms that is unsubstituted or substituted with one or more of a hydroxyl group, an alkoxy group, and an amino group, and at least one of $R_1$ to $R_4$ includes a hydroxyl group or an alkoxy group.

7. The silicon etchant composition of claim 6, wherein the alkanolamine-based compound is one selected from the group consisting of 1-amino-2-propanol, 2-amino-1-butanol, 3-amino-1-propanol, 3-amino-1,2-propanediol, methyldiethanolamine, propanolamine, ethanolamine, diethanolamine, N-methylethanolamine, N-methyldiethanolamine, 2-amino-3-methyl-1-butanol, 3-amino-2,2-dimethyl-1-propanol, tris(hydroxymethyl)aminomethane, 1,3-diamino-2-propanol, 2-amino-2-methyl-1,3-propanediol, 3-methylamino-1-propanol, 2-dimethylamino-2-methyl-1-propanol, 1-dimethylamino-2-propanol, 3-dimethylamino-1-propanol, 2-dimethylamino-1-propanol, 2-diethylamino-1-propanol, 2-diethylamino-1-ethanol, 2-ethylamino-1-ethanol, 1-(dimethylamino)2-propanol, diethanolamine N-propyldiethanolamine, N-isopropyldiethanolamine; N-(2-methylpropyl) diethanolamine, N-n-butyldiethanolamine, N-t-butylethanolamine, N-cyclohexyldiethanolamine, 2-(dimethylamino)ethanol; 2-diethylaminoethanol, 2-dipropylaminoethanol, 2-butylaminoethanol, 2-t-butylaminoethanol, 2-cycloaminoethanol, 2-amino-2-pentanol, 2-[bis(2-hydroxyethyl)amino]-2-methyl-1-propanol, 2-[bis(2-hydroxyethyl)amino]-2-propanol, N,N-bis(2-hydroxypropyl)ethanolamine, 2-amino-2-methyl-1-propanol triisopropanolamine, and combinations thereof.

8. The silicon etchant composition of claim 6, wherein the powdered silicon includes silicon or a structure in which a silicon oxide film is formed on the surface.

9. A pattern formation method, comprising:
    forming a silicon film on a substrate; and
    etching the silicon film using the silicon etchant composition of claim 1.

10. A manufacturing method of an array substrate, comprising the pattern formation method of claim 9.

* * * * *